United States Patent
Jeon

(10) Patent No.: US 7,541,210 B2
(45) Date of Patent: Jun. 2, 2009

(54) METHOD FOR FABRICATING CMOS IMAGE SENSOR

(75) Inventor: In Gyun Jeon, Gyeonggi-do (KR)

(73) Assignee: Dongbu Electronics Co., Ltd., Seoul (KR)

(*) Notice: Subject to any disclaimer, the term of this patent is extended or adjusted under 35 U.S.C. 154(b) by 439 days.

(21) Appl. No.: 11/318,504

(22) Filed: Dec. 28, 2005

(65) Prior Publication Data

US 2006/0138491 A1    Jun. 29, 2006

(30) Foreign Application Priority Data

Dec. 29, 2004    (KR) .................. 10-2004-0115761

(51) Int. Cl.
*H01L 21/00*    (2006.01)
(52) U.S. Cl. .................. 438/48; 438/66; 438/305
(58) Field of Classification Search .................. 438/48, 438/57, 60–99, 301–307, 510, 514, 518, 438/522, 527, 530
See application file for complete search history.

(56) References Cited

U.S. PATENT DOCUMENTS

| | | | | |
|---|---|---|---|---|
| 6,306,678 | B1 * | 10/2001 | Chiang et al. .................. 438/60 |
| 6,566,678 | B1 * | 5/2003 | Maeda et al. .................. 257/22 |
| 6,642,076 | B1 * | 11/2003 | Yaung et al. .................. 438/48 |
| 6,706,550 | B2 * | 3/2004 | Lee et al. .................. 438/57 |
| 6,731,337 | B2 * | 5/2004 | Watanabe .................. 348/308 |
| 7,063,998 | B2 * | 6/2006 | Kim .................. 438/48 |
| 7,420,233 | B2 * | 9/2008 | Rhodes et al. .................. 257/292 |
| 2002/0109160 | A1 * | 8/2002 | Mabuchi et al. .................. 257/233 |
| 2006/0076588 | A1 * | 4/2006 | Nozaki .................. 257/292 |

FOREIGN PATENT DOCUMENTS

| | | |
|---|---|---|
| JP | 60-018957 | 1/1985 |
| JP | 04-355964 | 12/1992 |
| JP | 2004-071628 | 3/2004 |
| JP | 2004-342836 | 12/2004 |

* cited by examiner

*Primary Examiner*—W. David Coleman
*Assistant Examiner*—Su C Kim
(74) *Attorney, Agent, or Firm*—McKenna Long & Aldridge LLP

(57) ABSTRACT

A CMOS image sensor and a method for fabricating the same are disclosed, in which transfer characteristics are improved. The method includes forming a photodiode region and a second conductive type ion region on a surface of a first conductive type substrate by implanting a second conductive type impurity ion into an entire surface of the substrate where a transistor is to be formed, forming a second conductive type lightly doped ion region in the substrate corresponding to the photodiode region by lightly implanting a second conductive type impurity ion only in an area where the photodiode region is opened, and diffusing the second conductive type lightly doped ion region into the second conductive type ion region by a thermal process.

10 Claims, 6 Drawing Sheets

METHOD FOR FABRICATING CMOS IMAGE SENSOR

This application claims the benefit of Korean Patent Application No. 10-2004-0115761, filed on Dec. 29, 2004, which is hereby incorporated by reference for all purposes as if fully set forth herein.

BACKGROUND OF THE INVENTION

1. Field of the Invention

The present invention relates to a complementary metal-oxide semiconductor (CMOS) image sensor, and more particularly, to a CMOS image sensor and a method for fabricating the same in which transfer characteristics are improved.

2. Discussion of the Related Art

A CMOS image sensor is a semiconductor device embedded with an integrated circuit having a plurality of pixels that convert light energy into electrical signals. CMOS image sensors are widely used in digital cameras, PC cameras, fingerprint recognition systems, cellular phones, toys, spacecraft fields, image pick-up devices of subminiature flying objects, etc.

A CMOS image sensor of a 4-Tr structure is most widely used, in which one pixel is comprised of four transistors (Tr) and one photodiode. In the related art CMOS image sensor of a 4-Tr structure, since a floating diffusion node is used as an output terminal as in a charge coupled device (CCD), it is likely that problems, such as image lagging, occur. To solve such problems, a structure in which a photogate electrode is formed on a photodiode to transfer an accumulated signal to an output node has been suggested. However, if the photogate is used as a poly electrode, photo-response characteristics of a manufactured device are deteriorated. To improve photo-response characteristics, however, using a transmitting electrode causes inconvenience.

In a related art CMOS image sensor pixel of a 4-Tr structure, a transfer transistor and a photodiode are formed as shown in FIG. 1.

As shown in FIG. 1, the transfer transistor 5 of a related art CMOS image sensor pixel of a 4-Tr structure includes an isolation oxide film or gate oxide film 2 formed on a P type well 10 of a substrate. Region A is shown. The sensor pixel also includes a gate electrode 4 formed on the gate oxide film 2, and first and second source and drain regions 12 and 14 formed in the P type well by ion implantation. The first source and drain region 12 of the transfer transistor 5 corresponds to a photodiode PD region. The second source and drain region 14 of the transfer transistor 5 has a lightly doped drain (LDD) structure. The LDD structure may be formed such that insulating spacers 6 formed at sidewalls of the gate electrode 4 serve as barriers that prevent ions from being implanted into some of the substrate during ion implantation. In the transfer transistor 5, a heavily doped N+ type region and a lightly doped N− type region are formed in the second source and drain region 14 by the spacer at the left of the gate electrode 4. The N+ type region in the second source and drain region 14 has a doping concentration of $1\times E^{20\sim21}/cm^3$ while the N− type region has a doping concentration of $1\times E^{19\sim20}/cm^3$. Then, N type doping is performed in the first source and drain region 12 at the same concentration as that of the N-type region. This prevents leakage current of the photodiode due to heavily doping from occurring. The N type doping region is referred to as a PDN region. Next, a P− type PDP region 18 is formed by implanting P type lightly doped ions into a surface of the substrate corresponding to the photodiode PD region using the spacer at the right of the gate electrode 4 as a barrier. The PDP region 18 reduces surface leakage.

In the aforementioned related art structure, the PDN region 12 adjoining a channel region (i.e., a substrate region below the gate electrode 4) at the surface of the substrate has a relatively low concentration. Thus, charge, such as electron charge, transfer ability is not satisfactory when a channel of the transfer transistor 5 is formed. This may adversely affect characteristics of the CMOS image sensor.

The charge transfer ability may be improved by controlling the doping concentration or energy to increase the PDN concentration at the surface of a silicon substrate. However, this may directly affect unique charge storage ability of the photodiode and its photoelectron collecting ability. Therefore, it is undesirable to select a method that controls the doping concentration or energy.

SUMMARY OF THE INVENTION

Accordingly, the present invention is directed to a CMOS image sensor and a method for fabricating the same, which substantially obviate one or more of the problems due to limitations and disadvantages of the related art.

An advantage of the present invention is to provide a CMOS image sensor and a method for fabricating the same, which improve transfer characteristics without reducing charge storage ability of a photodiode.

Additional features and advantages of the invention will be set forth in the description which follows, and in part will be apparent from the description, or may be learned by practice of the invention. The objectives and other advantages of the invention will be realized and attained by the structure and method particularly pointed out in the written description and claims hereof as well as the appended drawings.

To achieve these and other advantages and in accordance with the purpose of the present invention, as embodied and broadly described, a method for fabricating a CMOS image sensor includes forming a photodiode region corresponding to a first source and drain region of a transistor and a second conductive type ion region on a surface of a first conductive type substrate by implanting a second conductive type impurity ion into an entire surface of the substrate where the transistor is to be formed, forming a second conductive type lightly doped ion region in the substrate corresponding to the photodiode region by lightly implanting a second conductive type impurity ion only in an area where the photodiode region is opened, and diffusing the second conductive type lightly doped ion region into the second conductive type ion region by a thermal process.

In another aspect of the present invention, a CMOS image sensor includes a first conductive type semiconductor substrate including a transistor region and a photodiode region corresponding to a first source and drain region of a transistor, a second conductive type diffusion region formed in the substrate corresponding to the photodiode region, including a second conductive type ion region at an upper portion and a second conductive type lightly doped ion region at a lower portion, and a first conductive type ion region formed in a surface of the substrate corresponding to the photodiode region.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiment(s) of the invention and together with the description serve to explain the principle of the invention. In the drawings.

DETAILED DESCRIPTION OF THE INVENTION

Reference will now be made in detail to embodiments of the present invention, examples of which are illustrated in the accompanying drawings. Wherever possible, the same reference numbers will be used throughout the drawings to refer to the same or like parts.

Figure 1:
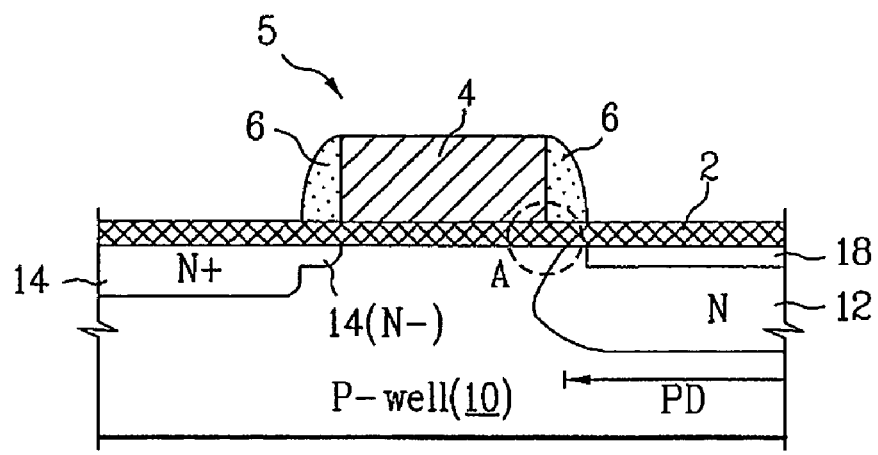
FIG. 1 is a sectional view illustrating a related art CMOS image sensor.
Figure 2:
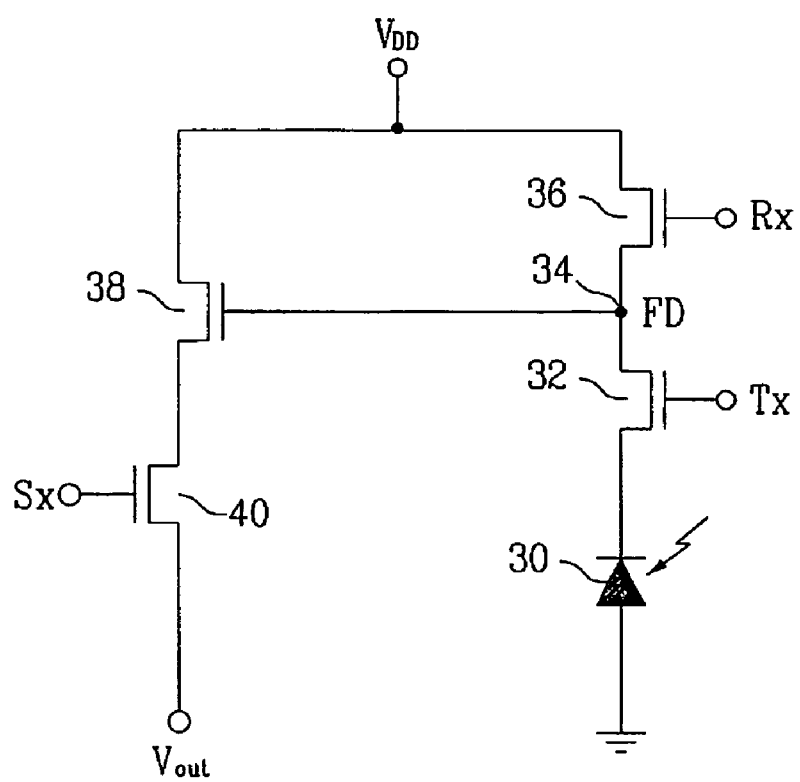
FIG. 2 is a circuit diagram illustrating a CMOS image sensor according to the present invention.
Figure 3:
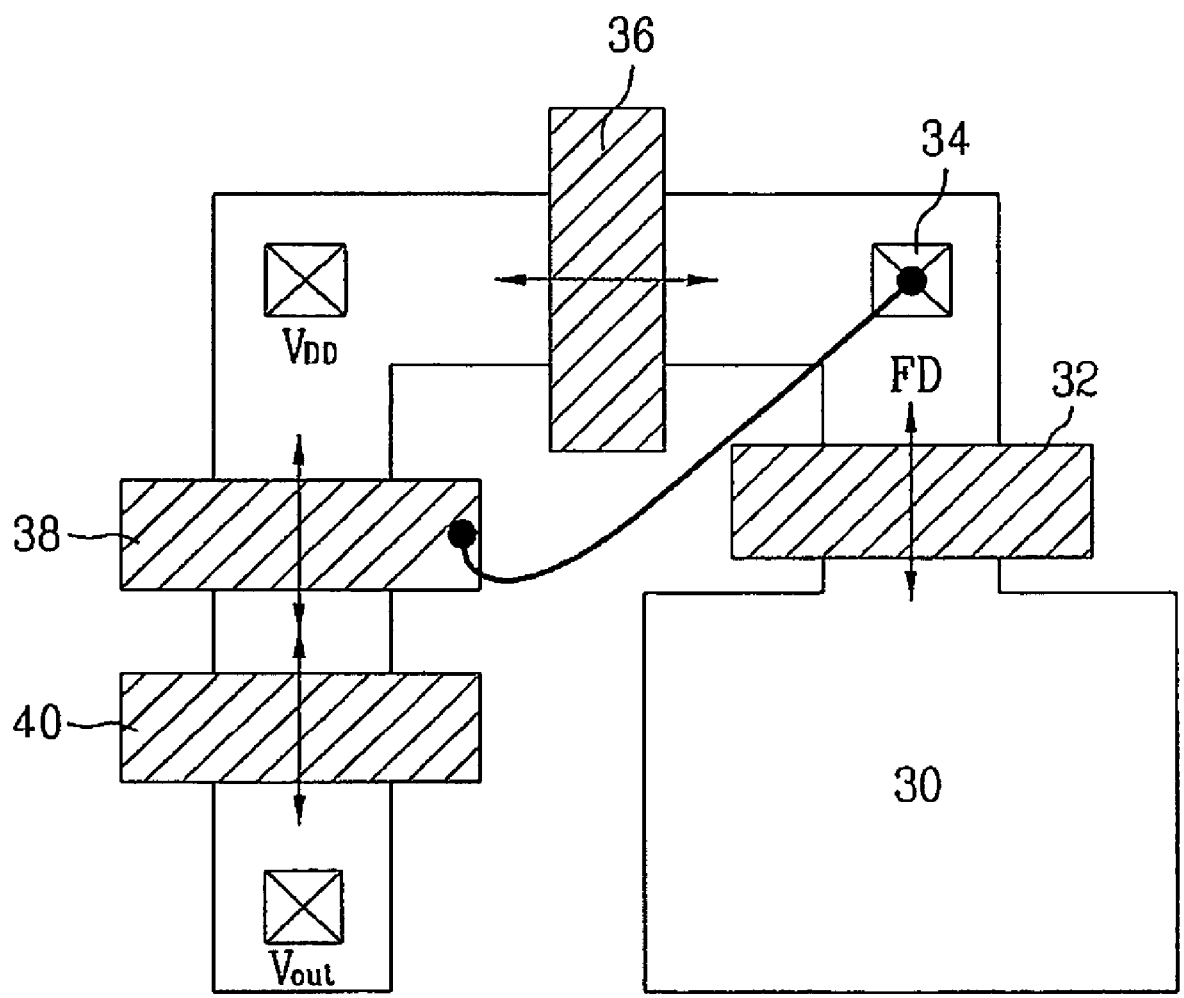
FIG. 3 is a layout illustrating a CMOS image sensor according to the present invention.

FIG. 2 is a circuit diagram illustrating a unit pixel of a CMOS image sensor according to the present invention and FIG. 3 is a layout illustrating the unit pixel.

The operation of the unit pixel of the CMOS image sensor according to the present invention will be described with reference to FIG. 2 and FIG. 3.

As shown in FIG. 2 and FIG. 3, the unit pixel of the CMOS image sensor includes one photodiode 30 and four transistors, i.e., a transfer transistor 32, a reset transistor 36, a drive transistor 38, and a selection transistor 40. If the transfer transistor 32 and the reset transistor 36 are turned on, a voltage $V_{DD}$ is transferred to the photodiode 30. Then, the transfer transistor 32 and the reset transistor 36 are turned off. The photodiode 30 collects light for a certain time period in such a manner that electron-hole pairs EHP or signal charges are generated in proportion to incident light to the photodiode 30. A source potential of the transfer transistor 32 is varied in proportion to the generated signal charges. If the transfer transistor 32 is turned on by a signal Tx, for example, a signal Tx of high voltage, that is inputted to a gate of the transfer transistor 32, the accumulated signal charges are transferred to a floating diffusion (FD) node 34. The potential of the FD node 34 is varied in proportion to the transferred signal charges. The source potential of the drive transistor 38 is varied depending on the varied potential of the FD node 34. The drive transistor 38 acts as a source follower transistor and serves as a signal amplifier. Also, the drive transistor 38 serves to improve noise or residual charges. If the selection transistor 40 is now turned on by a gate signal Sx, the selection transistor 40 reads data through an output terminal $V_{out}$. The reset transistor 36 is turned on and off by the gate signal Rx. If the reset transistor 36 is turned on, the FD node 34 becomes the voltage $V_{DD}$ to detect a reference value and waits for the detected signal. That is, the reset transistor serves to initiate the unit pixel of the CMOS image sensor.

Thus, the charge transfer ability of the transfer transistor 32 is significant because the signal detected by the photodiode 30 is output as an electrical signal through the output terminal $V_{out}$. This affects the characteristics of the CMOS image sensor. Particularly, the EHP generated by the photodiode is input to the source of the transfer transistor 32 as soon as the transfer transistor 32 is turned on, and is transferred to a drain (i.e., FD node) of the transfer transistor 32 through a channel. If EHP transfer characteristics of the transfer transistor 32 are poor, charges may be lost or deformed during the transfer operation.

FIG. 4A to FIG. 4E are sectional views illustrating process steps of fabricating the CMOS image sensor according to the present invention.

Figure 4A:
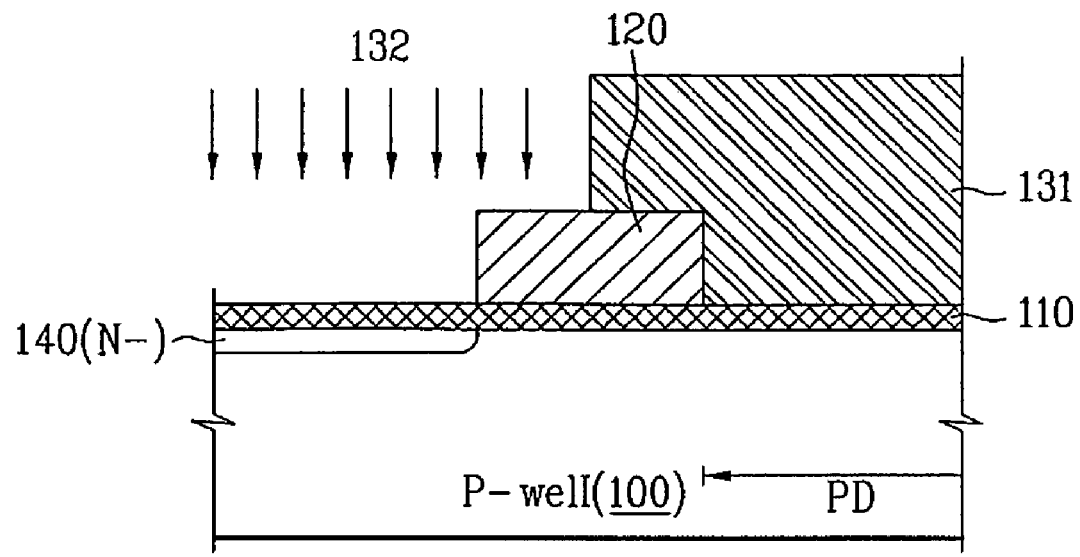
FIG. 4A to FIG. 4E are sectional views illustrating process steps of fabricating a CMOS image sensor according to the present invention.

First, as shown in FIG. 4A, an isolation oxide film or gate oxide film 110 is deposited on a substrate or a P type well 100, and a gate electrode 120 is formed on the gate oxide film 110. The gate oxide film 110 and the gate electrode 120 can be formed by a conventional method. Next, a photoresist film is deposited and then patterned by exposing and developing processes to form a photoresist film pattern layer 131 that opens only a second source and drain region 140. An N− type region 140 is formed in the second source and drain region 140 by a first ion implantation 132. The first ion implantation 132 may be performed at a concentration of $3 \times E^{14}/cm^3$ or $E^{19}/cm^3$ and ion implantation energy of 10 KeV using arsenic as an ion.

Figure 4B:
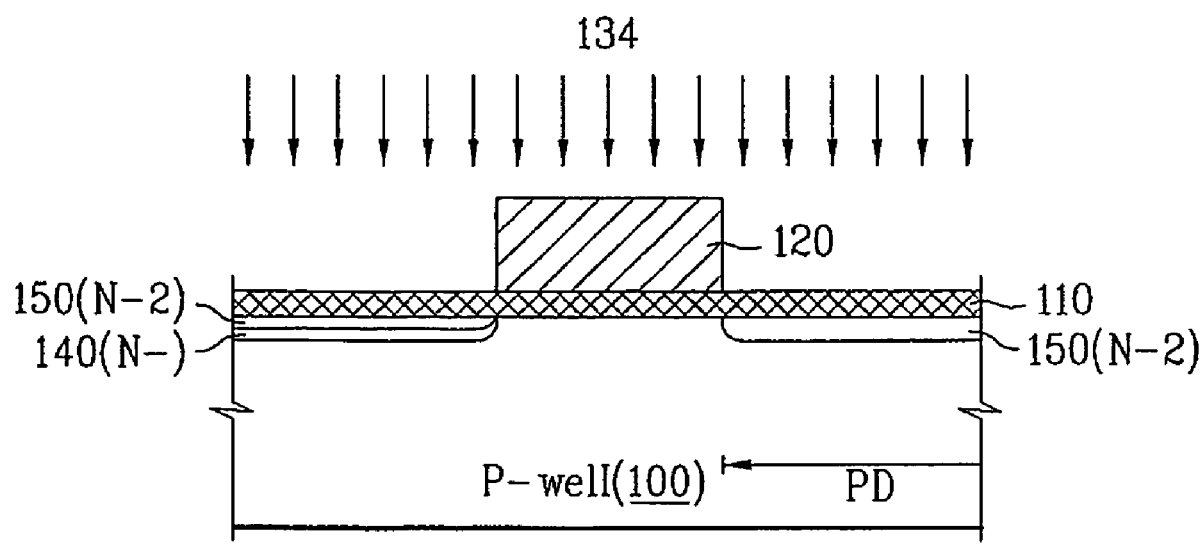

Subsequently, as shown in FIG. 4B, the photoresist film pattern layer 131 is removed, and an N−2 type region 150 is formed by a second ion implantation 134 on an entire surface of the substrate. The second ion implantation 134 may be performed at a low doping concentration of approximately $1 \times E^{16}/cm^3 - 1 \times E^{17}/cm^3$ or approximately $1 \times E^{11}/cm^3 - 5 \times E^{11}/cm^3$. Since the second ion implantation 134 is performed onto the entire surface of the substrate without additional photolithographic processing, the N−2 type region 150 is formed in both the second source and drain region 140 and a PD region, which corresponds to the first source and drain region.

The second ion implantation 134 for formation of the N−2 type region 150 may be performed at a doping concentration of approximately $1 \times E^{16}/cm^3 - 1 \times E^{17}/cm^3$ and ion implantation energy of 10 KeV to 50 KeV if phosphorous is used as an implantation ion. The second ion implantation 134 may be performed at a doping concentration of approximately $1 \times E^{16}/cm^3 - 1 \times E^{17}/cm^3$ and ion implantation energy of 30 KeV arsenic is used as an implantation ion.

Figure 4C:
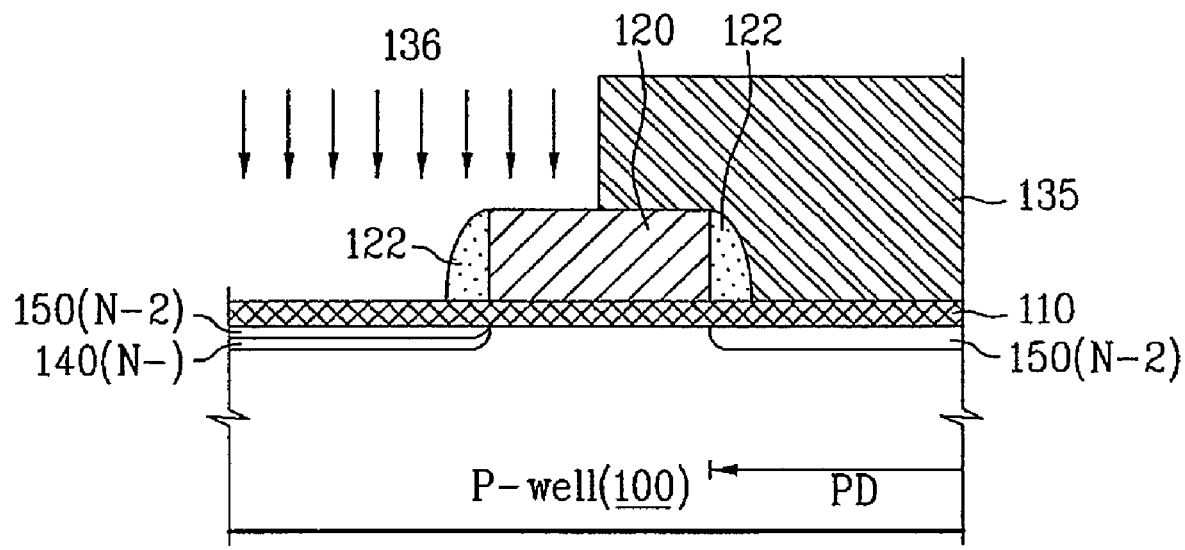

Next, as shown in FIG. 4C, spacers 122 are formed at sidewalls of the gate electrode 120. Then, an N+ type region 160 is formed by a third ion implantation 136 in an area where a photoresist film 135 is not formed and covers the PD region and exposes the second source and drain region. The N+ type region 160 corresponds to a conventional source and drain region of a MOS transistor and has an LDD structure. The third ion implantation 136 may be performed at a doping concentration of approximately $1 \times E^{20}/cm^3 - 1 \times E^{21}/cm^3$ and an ion implantation energy of 65 KeV using arsenic as an ion. The spacers 122 of the gate electrode 120 may be formed by a conventional method in which an oxide film is deposited on a gate electrode and etched by anisotropic etching to remain only at sidewalls.

Figure 4D:
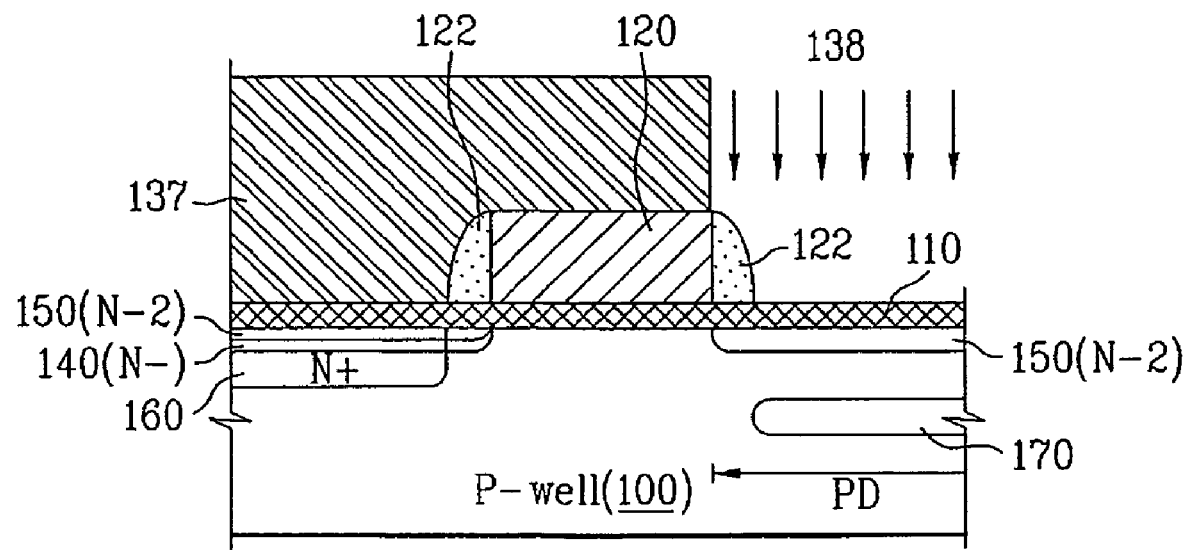
Figure 4E:
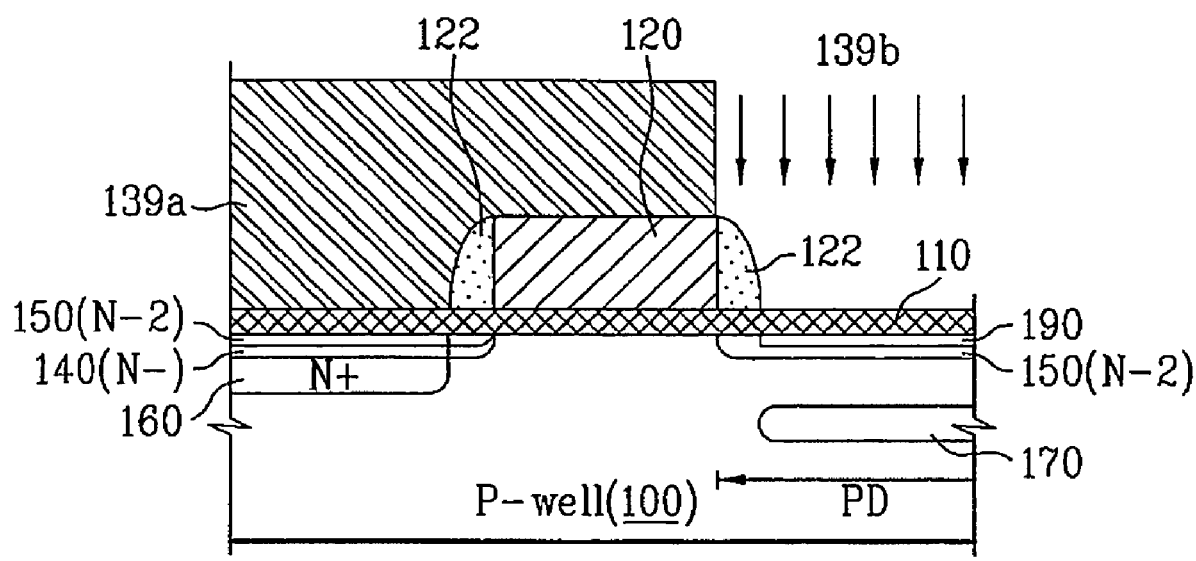

Referring to FIG. 4D, a photoresist film pattern 137 is formed so that the second source and drain region of the transfer transistor is turned off. A PDN region 170 is formed in the substrate of the first source and drain region by a fourth ion implantation 138 in an area where the PD region is opened. The fourth ion implantation 138 may be performed at a doping concentration of $1 \times E^{16}/cm^3$ or $3 \times E^{12}/cm^3$ or less and an ion implantation energy of 100 KeV to 160 KeV using phosphorus as an ion.

A photoresist film pattern 139a is formed so that the second source and drain region of the transfer transistor is turned off. A lightly doped PDP region 190 is formed in the surface of the substrate by a fifth ion implantation 139b in an area where the PD region is opened. The fifth ion implantation 139b may be performed at a doping concentration of $1\times E^{16}/cm^3$ or $2\times E^{12}/cm^3$ or less and an ion implantation energy of 20 KeV using $BF_2$ as an ion. It is immaterial if the gate electrode 120 is partially exposed by the fifth ion implantation 139b.

Figure 5:
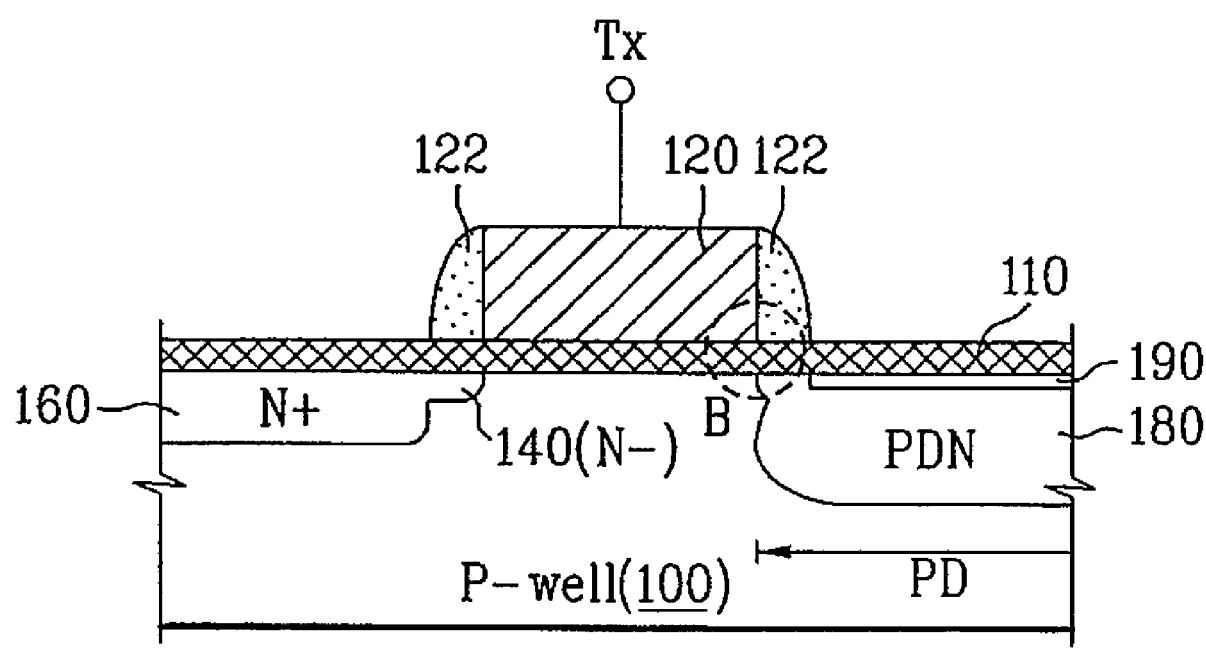
FIG. 5 is a sectional view illustrating a CMOS image sensor manufactured according to the present invention.

After the PDP region 190 is formed, a thermal process is performed. A dopant profile of the transfer transistor and the PD region is formed as shown in FIG. 5. Then, after the thermal process, a PDN/N-2 diffusion region 180 is formed as shown in the profile of FIG. 5. This is because the PDN region 170 formed in the substrate at a certain depth is diffused up and down in a Gaussian distribution due to the thermal process. Since the other doping regions 140, 150 and 190 are formed on the surface of the silicon substrate 100, they are diffused while maintaining their profiles even after the thermal process. By contrast, the PDN/N-2 diffusion region 180 is formed as the PDN region 170 is diffused up and down in the substrate. Therefore, the PDN/N-2 diffusion region 180 is formed as shown in the profile of FIG. 5.

As shown in FIG. 5, the transfer transistor in the unit pixel of the CMOS image sensor according to the present invention includes the first source and drain region, corresponding to a photodiode (PD) region, formed in the P type substrate 100, the second source and drain region, and the gate electrode 120 formed on the substrate. Region B is shown. If a predetermined bias voltage is applied to the gate electrode 120, a channel region is formed between the first source and drain regions 140 and 160 and the second source and drain region. The PDN/N-2 diffusion region diffused into the surface of the substrate is formed in the first source and drain regions 140 and 160. The channel region adjoins the PDN/N-2 diffusion region formed in the surface of the substrate at the photodiode region. Also, the N-2 region is extended to the channel region below the gate electrode 120 after passing through the substrate region below the spacers 122 of the gate electrode 120.

In another embodiment of the present invention, the N-2 ion implantation may be performed after the PDN region 170 is formed in the substrate. After the PDN region 170 is formed, the second source and drain region of the transfer transistor is turned off and the photoresist film pattern 137 is formed to open only the PD region. Then, the N-2 ion implantation is performed. In this embodiment, the region formed by the N-2 ion implantation is formed only in the first source and drain region, corresponding to the PD region, unlike FIG. 4B illustrating the N-2 ion implantation region formed in both the first source and drain region and the second source and drain region.

In still another embodiment of the present invention, the N+ ion implantation may be performed into the second source and drain region after the PDN region 170 is formed in the substrate. In this embodiment, after the PDN region 170 in the substrate is diffused by the thermal process, the N-2 ion implantation is performed to form the PDN/N-2 diffusion region 180.

Since the above embodiments have been described based on the source and drain regions of the LDD structure, the steps of implanting the N- ion to the second source and drain region and forming the spacers at the sidewalls of the gate electrode have been required. However, since the present invention is not limited to the LDD structure, the above steps may be omitted.

As described above, the CMOS image sensor and the method for fabricating the same according to the present invention have the following advantages.

Since the PDN/N-2 diffusion region in which the N-2 region and the PDN region are diffused exists in the first source and drain region, corresponding to the PD region, adjoining the channel region of the transfer transistor, it is possible to lower channel resistance of the source and drain regions and increase potential without reducing the charge storage ability of the photodiode. Therefore, the charge transfer ability can be improved. Thus, it is possible to improve characteristics of the CMOS image sensor.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method for fabricating a CMOS image sensor comprising:

forming a photodiode region corresponding to a first source and drain region of a transistor and a second conductive type ion region on a surface of a first conductive type substrate by implanting a second conductive type impurity ion into an entire surface of the substrate where the transistor is to be formed;

forming spacers at both sides of a gate electrode of the transistor after forming the second conductive type ion region;

forming a second conductive type lightly doped ion region in the substrate deeper than the second conductive type ion region corresponding to the photodiode region by lightly implanting a second conductive type impurity ion only in an area where the photodiode region is opened by a photoresist film;

forming a first conductive type ion region thinner than the second conductive type ion region on the surface of the substrate corresponding to the photodiode region by implanting a first conductive type impurity ion only in the area where the photodiode region is opened by the photoresist film; and forming a diffusion region diffused into the surface of the substrate in the photodiode region by diffusing the second conductive type lightly doped ion region into the second conductive type ion region by a thermal process.

2. The method of claim 1, further comprising forming a photoresist film patterned to open only a second source and drain region of the transistor and forming a second conductive type heavily doped ion region in the second source and drain region by heavily implanting a first conductive type impurity using the spacer formed at one side of the gate electrode as a mask.

3. The method of claim 2, wherein the second conductive type heavily doped ion region is deeper than the second conductive type ion region.

4. The method of claim 1, further comprising forming a first conductive type ion region thinner than the second conductive type ion region on the surface of the substrate corresponding to the photodiode region by implanting a first conductive type impurity ion only in an area where the photodiode region is opened, after the second conductive type lightly doped ion region is diffused by the thermal process.

5. The method of claim 1, wherein the first conductive type ion region is formed by implanting the first conductive type impurity ion at a doping concentration of $1 \times E^{16}$ atoms/cm$^3$ or less.

6. The method of claim 4, wherein the first conductive type ion region is formed by implanting the first conductive type impurity ion at a doping concentration of $1 \times E^{16}$ atoms/cm$^3$ or less.

7. The method of claim 1, wherein the second conductive type ion region is formed by implanting the second conductive type impurity ion at a doping concentration of $1 \times E^{16}$ atoms/cm$^3$–$1 \times E^{17}$ atoms/cm$^3$.

8. The method of claim 7, wherein the second conductive type ion region is formed by using phosphorus or arsenic as the second conductive type impurity ion.

9. The method of claim 8, wherein the second conductive type lightly doped ion region is formed by implanting the second conductive type impurity ion at a doping concentration of $1 \times E^{16}$ atoms/cm$^3$ or less.

10. The method of claim 1, wherein the transistor is a transfer transistor.

* * * * *